United States Patent [19]

Collins et al.

[11] 4,010,423
[45] Mar. 1, 1977

[54] MULTI-FUNCTION REMOTE CONTROL IC

[75] Inventors: Johnny Collins, Oak Park; Charles H. Heuer, Glencoe, both of Ill.

[73] Assignee: Zenith Radio Corporation, Chicago, Ill.

[22] Filed: June 26, 1975

[21] Appl. No.: 590,771

[52] U.S. Cl. .................. 325/391; 178/DIG. 15; 325/392; 340/171 R
[51] Int. Cl.² .......................................... H04B 1/16
[58] Field of Search ............... 325/390–392, 325/395–397, 399, 37; 178/DIG. 15; 343/225, 228; 340/147 PC, 148, 168 R, 168 CC, 171 R

[56] References Cited

UNITED STATES PATENTS

| 3,537,012 | 10/1970 | Reichard et al. | 325/391 |
| 3,854,123 | 12/1974 | Banach | 340/171 R |
| 3,855,575 | 12/1974 | Leuschner et al. | 340/148 |
| 3,903,472 | 9/1975 | Wahl | 325/392 |

*Primary Examiner*—Robert L. Griffin
*Assistant Examiner*—Marc E. Bookbinder
*Attorney, Agent, or Firm*—Nicholas A. Camasto

[57] ABSTRACT

An integrated digital circuit for a wireless remote control system employs a first counter to distinguish the frequency of actuating signals and a confidence counter for establishing a minimum duration for an actuating signal. Logic circuitry responsive to an externally applied voltage level controls the operation of a three stage binary counter and a flip-flop to selectively initiate a first mode utilizing two frequencies for control of an eight step bi-directional volume function and a second mode in which the same two frequencies control a four state cyclic volume function and a bi-stable picture control.

5 Claims, 1 Drawing Figure

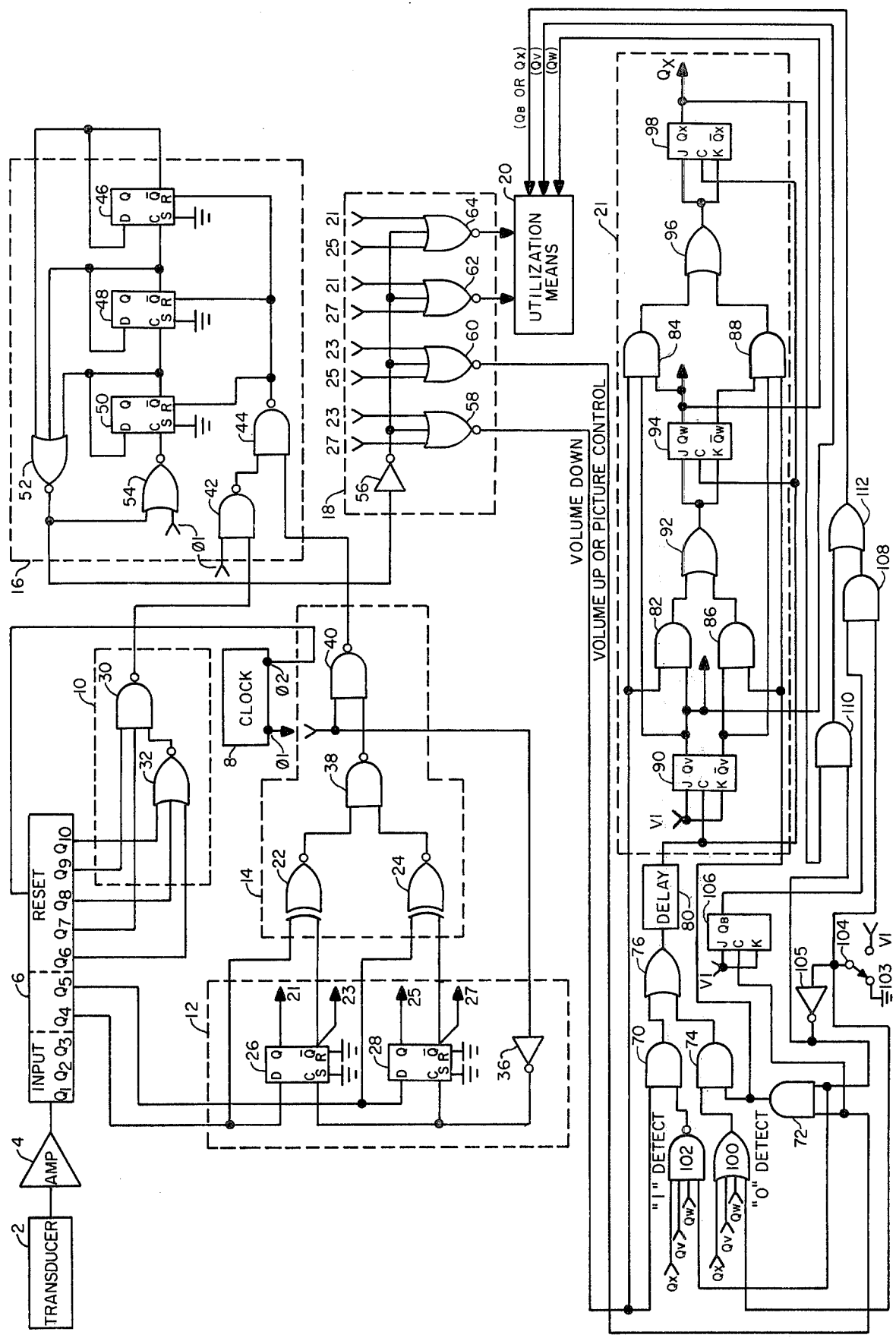

MULTI-FUNCTION REMOTE CONTROL IC

CROSS-REFERENCE TO RELATED APPLICATION

This application is related to copending application, Ser. No. 556,760, filed Mar. 10, 1975 and entitled "Digital Remote Control System with Signal Verification" in the names of Robert R. Podowski and Johnny Collins, and Ser. No. 582,048, filed May 29, 1975 entitled "Remote Control with Reduced Responsiveness to Interrupted Actuating Signals" in the names of Johnny Collins, Richard G. Merrell and David A. Blass, both of which are assigned to the assignee of the present application and which are hereby incorporated by reference.

BACKGROUND OF THE INVENTION

Ultrasonic remote control systems have for years been a popular control medium for television receivers and are well known in the art. Such systems normally include a transmitter containing rods which when struck produce a predetermined acoustic frequency and a transducer in the receiver for converting these control signals into corresponding electrical signals. Noise immunity is normally achieved by requiring that a control signal have a constant amplitude for some fixed period of time. Detection circuitry usually includes tuned circuits equal in number to the actuation frequencies adapted so that a selected frequency will cause resonance within a corresponding circuit. For design variations any of the activation frequencies may be changed by merely changing the length of the struck rod and the components of the corresponding tuned circuit.

Ultrasonic remote control systems can be designed and fabricated in an integrated circuit by employing digital techniques. As before, several predetermined frequencies are employed to activate corresponding functions. Generally, a clock is coupled to a counter which samples the incoming signal to determine its frequency and noise immunity is achieved as for the conventional circuit. The digital systems actually count the actuation signal frequency in predetermined timing intervals. The system responds to these various counts and the actuation frequencies once selected must remain fixed. A problem which arises is to provide for some variation in digital remote control systems while taking advantage of the simultaneous fabrication and interconnection offered by integrated circuit technology. A digital IC system once formed will only respond to the predetermined frequencies which give the proper count during the timing interval.

The principal advantage of an integrated circuit is that once the design format is determined a cost savings can be gained with a high volume production of units. For television receivers the number of remote control units is considerably smaller than the number of total television sets produced. In addition providing a variety of remote control systems would again diminish the number of production units and could reach a point where the question of whether or not an integrated circuit should be used would arise.

An additional cost consideration arises from the number of pins required to interface the integrated circuit with the remainder of the electronic system. The cost vs. number of pins required for an integrated circuit package is not a linear function and in some cases one more pin can add considerable cost because a much larger package may have to be used. Therefore if one wishes to provide design variety with an integrated circuit, and maintain cost effectiveness, the circuit should have a minimum number of output pins.

Applicants' invention resolves these problems by including logic gates which establish control for differing functions depending upon an outside logic level selection. It provides the desired design variation on a single chip to take advantage of high volume production and utilizes common output pins to retain the advantages of a package with a smaller number of output pins.

OBJECTS OF THE INVENTION

An object of this invention is to provide a novel integrated circuit remote control system.

Another object of this invention is to provide an improved integrated circuit remote control system with capacity for design variation.

SUMMARY OF THE INVENTION

In accordance with the invention an integrated digital circuit having a predetermined number of output pins for selectively activating functions of a television receiver in response to actuating signals, comprises means receiving and translating said actuating signals, counting means for distinguishing among actuating signals based on frequency, means for actuating functions corresponding to frequency in response to the counting means and logic means responsive to an externally applied voltage level utilizing the common output pins for selectively initiating a first mode in which two preselected frequencies control a multistate bi-directional function and a second mode in which the same two preselected frequencies control a multistate cyclic function and a distinct bi-stable function.

BRIEF DESCRIPTION OF THE DRAWING

The single FIGURE shows the detailed circuitry of the preferred embodiment of the invention with functional segments enclosed by broken lines. For simplicity, only logic connections are shown in the figure without connections to voltage sources. Positive logic is used throughout and logic gates are simply referred to by their functional names, i.e., NAND, EXCLUSIVE OR and NOR, without the word "gate." A 1 represents a high logic (or signal voltage) level and a 0 corresponds to a low logic level. All binary representations are arranged in ascending powers of two from left to right to correspond to the terminal arrangement of the binary counters.

The terms "input" and "output" generally indicate the device terminal unless signal is specified. The term "inhibit" indicates the condition in which a gate output is no longer dependent upon signals applied to its remaining inputs. The term "enable" designates the condition in which a gate output is dependent upon the signals applied to the remaining inputs.

DESCRIPTION OF THE PREFERRED EMBODIMENT

Referring to the drawing for a general description of the function of the circuit, a transducer 2 converts received signals, such as acoustic signals in a ultrasonic frequency range, into corresponding electrical signals of the same frequency. The control signals have individual characteristics, namely their frequencies, and, as will be seen, a common characteristic of persistence for a minimum duration. An amplifier 4 is coupled between transducer 2 and a 10-stage binary counter 6 for providing properly shaped and amplified pulses for counting. Transducer 2 and amplifier 4 are not on the integrated circuit chip but are included to understand the function of the circuit. Counter 6 samples, under the control of clock 8, the incoming signal to determine its frequency, and is connected to a range detection circuit 10. As mentioned, frequency is the individual characteristic by which the various control signals are distinguished. Confidence counter 16 is responsive to range circuit 10 and resets when an out-of-range count is detected.

Counter 6 is coupled directly to a storage circuit 12 and a comparator 14. A portion of the frequency count is compared with the immediately preceding count portion (a reference) and stored. The output of storage circuit 12 is also coupled to comparator 14 which, in turn, is coupled to confidence counter 16. Comparisons which show identity between present and previous count portions permit counter 16 to advance without resetting, whereas detection of a non-identity condition causes counter 16 to reset. Clock 8 is coupled to counter 6, storage circuit 12, comparator 14 and confidence counter 16 to provide an appropriate operational timing sequence. Storage circuitry 12 and confidence counter 16 are independently coupled to a decoder 18. When confidence counter 16 has been advanced to a predetermined count, decoder 18 is enabled to decode the stored count portion and supply an appropriate signal to a plurality of utilization means 20 for activation of the selected control function.

Continuing in greater detail, counting by the first three stages of counter 6 is ignored, allowing a range of frequencies to designate individual control functions. This may be easily explained by analogy to the operation of a simple two digit decimal counter. By ignoring the units digits and monitoring only the tens digit, ranges will be detected. Thus, the tens digit will be 0 in the range of 0 to 9, 1 in the range of 10 to 19, etc. The $\phi 2$ terminal of clock 8 is connected to the reset terminal of counter 6. The Q6, Q8 and Q10 terminals of counter 6 are connected to inputs of a NOR 32 whose output is coupled to one input of a NAND 30. The Q7 and Q9 terminals of counter 6 are connected to the second and third inputs of NAND 30. As indicated by the enclosing broken line, NOR 32 and NAND 30 comprise range detection circuit 10.

The Q4 terminal of counter 6 is connected to one input of an EXCLUSIVE OR 22 and to the D terminal of a data flip-flop 26. The Q5 terminal of counter 6 is coupled to one input of an EXCLUSIVE OR 24 and to the D terminal of a data flip-flop 28. EXCLUSIVE OR's are a form of logic gate which produce a 0 logic level signal at its output whenever both inputs are at the same logic level and a 1 logic level signal output otherwise. The $\phi 1$ terminal of clock 8 is connected through an inverter 36 to the C terminals of flip-flops 26 and 28. For convenience, the Q and Q terminals of flip-flops 26 and 28 are labelled 21, 23, 25 and 27, respectively. As indicated by the enclosing broken line, flip-flops 26 and 28 and inverter 36, comprise storage circuit 12.

The R and S terminals of both flip-flops 26 and 28 are connected to ground. The Q terminal of flip-flop 26 is connected to the second input of EXCLUSIVE OR 22 and the Q terminal of flip-flop 28 is connected to the second input of EXCLUSIVE OR 24. The outputs of EXCLUSIVE OR's 22 and 24 are connected to the inputs of a NAND 38 whose output is connected to the second input of NAND 40. The $\phi 1$ terminal of clock 8 is connected to the second input of NAND 40. As indicated by the broken line, EXCLUSIVE OR's 22 and 24 and NAND's 38 and 40 comprise comparator 14.

The $\phi 1$ terminal of clock 8 is connected to one input of NAND 42 and the output of NAND 30 is connected to the second input of NAND 42. The output of NAND 42 is connected to one input of NAND 44 and the output of NAND 40 is connected to the second input of NAND 44. As indicated by the broken line, flip-flops 46, 48 and 50, NOR's 52 and 54 and NAND's 42 and 44 comprise confidence counter 16. The output of NAND 44 is coupled to the R terminals of each of flip-flops 46, 48 and 50, the S terminals of which are connected to ground. The Q terminal of flip-flop 50 is connected to the C terminal of flip-flop 48 and the Q terminal of flip-flop 48 is coupled to the C terminal of flip-flop 46. The Q and the D terminals of each of flip-flops 46, 48 and 50 are connected to the three inputs of a NOR 52. The output of NOR 52 is connected to an input of NOR 54. The $\phi 1$ terminal of clock 8 is connected to the second input of NOR 54 and the output of NOR 54 is connected to the C terminal of flip-flop 50.

As indicated by the broken line, decoder 18 comprises an inverter 56 coupled to one input each of a plurality of NOR's 58, 60, 62 and 64. The output of NOR 52 is connected to inverter 56. Storage circuitry 12 is coupled to decoder 18 in the following manner: terminals 21 and 25 are connected to the second and third inputs of NOR 64; terminals 21 and 27 are connected to the second and third inputs of NOR 62; terminals 23 and 25 are connected to the second and third inputs of NOR 60; and terminals 23 and 27 are connected to the second and third inputs of NOR 58. The output terminals of NOR's 62 and 64 are connected to a utilization means 20 and will maintain logic levels which activate utilization means 20 corresponding to the various controlled functions.

Utilization means 20 is shown in a separate block and comprises the circuitry and apparatus (not illustrated) for actuating the controlled functions. The decoding NOR gates may be connected to single flip-flops for providing off-on action of various control functions or to a stepper motor for providing more complicated functions, such as tuning the television receiver. Such voltage responsive control techniques are well-known to those skilled in the art and are not a part of this invention.

The output of NOR 58 is coupled to one input each of an AND 70, an AND 82 and an AND 84. The output of NOR 60 is connected to one input of an AND 72 and to the clock terminal of a flip-flop 106. The output of AND 72 is connected to one input each of an AND 74, an AND 86 and an AND 88. The outputs of AND's 70 and 74 are coupled to the inputs of OR 76. The output of OR 76 is connected to delay circuit 80, which while shown in block form, may consist of a simple RC time delay circuit. The output of delay circuit 80 is coupled to the clock terminal of flip-flops 90, 94 and 98. Flip-flops 90, 94 and 98 are arranged in the form of a three stage binary counter 21, enclosed by a broken line. Flip-flop 90 has its J and K terminals supplied with a voltage corresponding to a 1 logic level and its Q terminal coupled to each of the second inputs of AND's 84 and 82. The Q terminal of flip-flop 90 is coupled to each of the second inputs of AND's 86 and 88. The outputs of AND 82 and 86 are coupled to the inputs of OR 92. The output of OR 92 is coupled to the J and K terminals of flip-flop 94. The Q terminal of flip-flop 94 is coupled to the third input of AND 84 and the $\bar{Q}$ terminal of flip-flop 94 is coupled to the third input of AND 88. The outputs of AND's 84 and 88 are coupled to the inputs of OR 96. The output of OR 96 is coupled to the J and K terminals of flip-flop 98.

A switch 103 is shown for selective application of 0 and 1 voltage levels to the circuit. The switch itself is not part of the circuit but terminal 104 is an input terminal for the integrated digital circuit. Terminal 104 is coupled to the first input of OR 100 and AND 108 and to the input of inverter 105. The output of inverter 105 is coupled to the second input of AND 72, to a first input of NAND 102 and to the first input of AND 110. The Q terminals of flip-flops 90, 94 and 98 are coupled respectively to the remaining three inputs of OR 100 and the $\bar{Q}$ terminals of flip-flops 90, 94 and 98 are coupled respectively to the remaining three inputs of NAND 102. The output of OR 100 is connected to the second input of AND 74 and the output of NAND 102 is connected to the second input of AND 70. The $\bar{Q}$ terminal of flip-flop 98 is coupled to the second input of AND 110. The Q terminal of flip-flop 106 is coupled to the second input of AND 108 and flip-flop 106 has its J and K terminals supplied with a voltage corresponding to a 1 logic level. The output of AND 110 and AND 108 are coupled to the inputs of OR 112. The output of OR 112 is coupled to utilization means 20 and transmits the Q terminal logic level on either of flip-flop's 106 or 98. The Q terminals of flip-flops 90 and 94 are also coupled to utilization means 20.

The timing sequence for the control unit is determined by clock 8. Clock 8 may be operated from the power line to which the television receiver or control unit is connected. The timing signal at the $\phi1$ clock terminal is a short duration (approximately 2 microseconds long) positive rectangular pulse of a 1 logic level which occurs every 8.33 ms. (millisecond). The timing signal at the $\phi2$ terminal is approximately a 2 microsecond rectangular pulse of a 1 logic level whose positive going leading edge corresponds to the occurrence of the trailing edge of a $\phi1$ pulse. The $\phi2$ pulse is used exclusively to reset counter 6 for the next sampling period. The 1 level portion of the $\phi1$ pulse establishes the comparison interval and produces a reset signal for confidence counter 16 during non-identity of a comparison or during an out-of-range condition. Because the clock terminals of the data flip-flops respond to edge triggering, data is transferred to storage circuit 12 and confidence counter 16 is advanced, after an identity comparison, during occurrence of the trailing edge of a $\phi1$ pulse.

Counter 6 is a continuously operating ten stage binary ripple counter which is reset to zero every 8.33 ms. It counts the frequency of the incoming signals to determine if they are control signals. There are many other forms of signal encoding which may be used to differentiate between control signals. Pulses arranged in a distinctive pattern is one example. For frequency differences, the sampling counter, storage circuit and comparator represent signal pattern recognition means. The counter supplies information to storage circuit 12, comparator 14 and range detection circuit 10. The output signals from range detection circuit 10 and from comparator 14 are combined and confidence counter 16 is reset whenever a non-identity or out-of-range condition occurs. As will be described later the reset may be made to occur with any predetermined number of non-identity determinations but in the preferred embodiment reset is performed upon one such detection.

Confidence counter 16 is a three stage binary counter initially established, by a reset pulse from NAND 44, at a 111 state (decimal 7) as determined by the logic levels on the Q terminals. Each in-range identity comparison permits the confidence counter to be clocked by the $\phi1$ timing pulses through NOR 54 to count down without being reset until it reaches a 000 state, indicating that the received signal is properly verified as additionally possessing the proper duration (predetermined common characteristic) of a control signal. If either an out-of-range or non-identity condition is detected, confidence counter 16 is reset to the 111 state to again being counting down by the $\phi1$ timing pulses. When verification has been made the NOR gate which corresponds to the particular control signal frequency is enabled to control utilization means for activating the corresponding control function.

To aid in understanding the operation of the circuit, assume that the control signals are square waves having four ultrasonic frequency ranges A, B, C and D comprising 38.4 to 39.24 KHz, 39.36 to 40.20 KHz, 40.32 to 41.16 KHz and 41.28 to 42.12 KHz corresponding to four television control functions respectively. The short duration $\phi1$ and $\phi2$ timing pulses may occur any time during detection of the relatively long period of the control signals without substantially disturbing the counting of counter 6. In the 8.33 ms. counting interval, the frequencies in the above ranges correspond to decimal counts of 320–327, 328–335, 336–343 and 344–351 respectively. For frequency range A, the 10 stage counter will read (binary counter notation) XXX0001010. For range B the counter will read XXX1001010. In the C and D ranges, the Q4 and Q5 terminals are respectively 01 and 11, and the Q6 through Q10 terminals will remain at 01010. The output of NOR 32 is at 1 for Q6 and Q8 and Q10 at 0. This output signal level is combined with Q7 and Q9 1 level output signals to produce a 0 level output signal from NAND 30, which indicates the detected signal frequency is in the proper range.

EXCLUSIVE OR 22 compares the signal at the Q terminal of flip-flop 26 (which is the inversion of the previous Q4 output signal level of counter 6) with the present Q4 signal level. If its inputs are at different signal levels, the output of the EXCLUSIVE OR is at 1, indicating identity between the present and previous Q4 signal levels. Similarly, EXCLUSIVE OR 24 compares the signal level on the Q5 terminal with the inversion of the previous Q5 signal present at the $\bar{Q}$ terminal of flip-flop 28. Again, if the inputs are different, the output of EXCLUSIVE OR 24 is at 1 indicating identity between the present and previous Q5 signal levels. For an identity between the previous and present signal levels of both Q4 and Q5, the inputs of NAND 38 are at 1 and its output is at 0. Thus, one input of NAND 40 is at 0 as long as there is identity in the comparator. During an $\phi1$ timing pulse the second input of NAND 40 is at 1 and its output remains at 1. If, however, the output of NAND 38 is at 1, indicating a non-identity, the output of NAND 40 assumes a 0 level for the $\phi1$ pulse duration. The signal from range detector 10 (represented by the output of NAND 30) is combined with $\phi1$ pulse in NAND 42 whose output is combined with the output of comparator 14 (represented by the output of NAND 40) in NAND 44.

Assume an in-range count (NAND 30 is at 0), and an identity indication in the comparator (NAND 40 is at 1). The output of NAND 42 is at 1 and correspondingly the output of NAND 44 is at 0. Thus, no resetting of flip-flops 46 through 50 occurs. The confidence counter counts down with each $\phi1$ pulse (corresponding to a simultaneous identity comparison and an "in-range" condition) to indicate an increased level of confidence. Confidence counter 16 comprises three DATA flip-flops arranged to form a simple three stage resettable binary counter having the Q terminals connected to the D terminals to insure the sequence of alternate states. Counting continues during subsequent $\phi1$ counting intervals until full confidence is reached (verification of a control signal has been made). Except for a simultaneous in-range count and an identity comparison, a reset pulse is supplied to confidence counter 16 which forces the establishment of a 111 state.

The storage, comparison and confidence counting operations are performed according to a fixed timing sequence. Assume initially that terminals 21 and 25 of storage flip-flops 26 and 28 respectively are at 0 and that counter 6 has just been reset by a $\phi2$ pulse to begin a new counting interval. As counting proceeds, the Q4 and Q5 terminals continuously supply signals to the D terminals of flip-flops 26 and 28, respectively, as well as to EXCLUSIVE OR's 22 and 24 in the comparator circuit. The comparator output normally indicates identity through NAND 40. For a non-identity the output of NAND 40 goes to a 0 level signal during the $\phi1$ timing pulse.

Assume now that an out-of-frequency range signal is received, but that during the $\phi1$ timing pulse the D terminals of flip-flops 26 and 28 remain at 0. The comparator indicates identity but the range detection circuit indicates an out-of-range condition as evidenced by a one level output signal at NAND 30 since the Q6–Q10 terminals are not at 01010, respectively. Because of the out-of-range condition, during the $\phi1$ pulse the output of NAND 42 goes to 0 and the output of NAND 44 goes to 1, which resets flip-flops 46, 48 and 50 to re-establish a 111 state in confidence counter 16. With the three inputs of NOR 52 at 1 its output is at 0. This signal level is combined with a $\phi1$ timing pulse in NOR 54, whose output goes to 0 during $\phi1$ pulse duration.

The C terminals of the DATA flip-flops employed in this circuit are responsive to positive going edges of rectangular pulses. The trailing or positive going edge of the pulse at the output of NOR 54 is employed to clock the confidence counter through the C terminal of flip-flop 50 to advance it to its next state, indicating that an identity had been detected in the comparator. The sequence of resetting to a 111 state and clocking occurs at the confidence counter during the detection of non-control frequencies.

The $\phi1$ terminal of clock 8 is coupled to inverter 36, whose output is normally at 1 but goes to 0 for the duration of the $\phi1$ pulse, and is used to clock the C terminals of flip-flops 26 and 28. When these storage flip-flops are clocked, the signal levels on their D terminals are transferred to their Q terminals. If, for example, during the next counting interval Q4 and Q5 go to 1, and correspondingly the D terminals of flip-flops 26 and 28, then at the end of the next $\phi1$ timing pulse the new data will be stored in the flip-flop. Thus, with each succeeding $\phi1$ timing pulse a comparison is made and, at the end of the comparison, the storage flip-flop are clocked so that the Q terminals maintain the last previous Q4 and Q5 signal levels.

Flip-flops 46 through 50 count the number of $\phi1$ pulses, for which simultaneous identity comparisons and in-range conditions have been determined, by advancing at the end of each $\phi1$ pulse duration until a 000 state is reached. This verifies that a control signal has been received. Verification thus comprises a predetermined number of repetitive occurrences of identity comparisons for in-range frequencies. When verification occurs the output of NOR 52 goes to 1 and inhibits the further operation of NOR 54 preventing further change in confidence counter 16.

When confidence has been achieved the 1 level at the output of NOR 52 is inverted by inverter 56 to a zero level which enables NOR's 58 to 64. It should be noted that until verification is achieved the entire decoding arrangement of NOR's is disabled. Each NOR corresponds to a different combination of signal levels at the Q4 and Q5 terminals of counter 6, which, because of the ignoring of the first three counter stages, corresponds to a frequency range. In particular, NOR 64 corresponds to range A, NOR 60 to range B, NOR 62 to range C and NOR 58 to range D. A verified control signal in the selected frequency range causes the second two inputs of the corresponding NOR gate to be at 0 thus providing a 1 level output lasting until confidence counter 16 is reset. Thus, the function may be activated as long as the control signal is received. Although not shown, a simple flip-flop dividing arrangement may be combined with the output of NAND 40 to provide for maintaining the operation of the circuit during non-identity and out-of-range conditions. This would maintain the 1 level signal at the output of NAND 40 until a predetermined number non-confidence conditions had been detected. Rather than resetting the confidence counter immediately upon detection of a non-identity comparison the inclusion of a flip-flop divider would produce a verification range having both an upper confidence count, derived from the maximum permissible count on the confidence counter 16, and a lower confidence count dependent upon the number of dividing flip-flops added to the circuit.

NOR 58 (frequency range D) is designated as the volume down command and NOR 60 (frequency range B) is designated in the alternative as the volume up command or a picture control function. Both frequencies initiate signals which are supplied to three stage binary counter 21. Counter 21 is a bi-directional counter whose direction is determined by enabling a series of parallel AND gates. This counter is quite similar to the synchronous up/down counter shown on page 124 of the Computer Lab Workbook, Copyright 1968 by the Digital Equipment Corporation. The slight differences in counter 21 are that positive logic is used, no provision is made for resetting to a particular state and the same signal for determining the direction of count is delayed and supplied to the clock terminals to initiate the actual count advancement. There is an inverse relationship between the direction of counting and the direction of volume level due to the interconnection with the subsequent circuitry. The lowest counter state corresponds to the maximum volume level and vice-versa. When a volume down command is given, NOR 58 is at a one level which enables the counter to count up by enabling AND 82 and AND 84. After a predetermined delay interval the same enabling signal provides the counting pulse. Similarly, a signal for volume up will cause the counter to count down. Counter 21 has two distinct modes of operation as determined by the logic level on input terminal 104. For a 0 level at terminal 104 counter 21 will operate as a normal three stage binary counter having eight corresponding volume steps and two directions. Counter 21 is also provided with counting stops. OR 100, NAND 102 and AND's 70 and 74 comprise counting stops which prevent counter 21 from operating in a cyclic manner. OR 100 which is enabled by a 0 level at input terminal 104 detects the 000 state of the counter and the normally 1 output of OR 100 becomes 0 thereby inhibiting AND 74 and preventing a command for volume up from further reducing the count which would produce cyclic counting. Similarly, NAND 102 is enabled by a 1 level at the output of inverter 105 to respond to the condition of 111 on counter 21 and the normally 1 level output of NAND 102 becomes 0, thereby inhibiting AND 70 from responding to additional volume down commands to prevent increasing the count which would produce cyclic counting. When input terminal 104 is at a 0 level the 1 level output of inverter 105 enables the output of AND 110 to correspond to the Q terminal of flip-flop 98 which is then supplied to OR 112. The output of OR 112 corresponds to the signal level at the Q terminal of flip-flop 98. Under the condition of 0 logic level at terminal 104 the normal outputs of the counter which corresponds to the Q terminals of flip-flops 90, 94 and 98 provide the outputs supplied directly to utilization means 20. Thus, the counter operates in normal fashion with the three binary outputs corresponding to eight possible volume states and the counter functions as a non-cyclic bi-directional counter.

The outputs of AND 70 and 74 supply in the alternative up or down commands to OR gates 76 which are then supplied to counter 21. When input terminal 104 is at a 1 level both the 0 and 1 detectors (OR 100 and NAND 102) will be disabled so that the counter may operate in a cyclic manner. Under these conditions the 0 level at the output of inverter 105 inhibits at AND 110 the Q output of flip-flop 98. The first and second stage Q level output corresponding to the flip-flops 90 and 94 are, as before, directly supplied to utilization means 20. This provides the four step cyclic (one direction) volume function with the highest order binary stage being ignored. When input terminal 104 is at a 1 level ANd 72 is inhibited from passing volume up commands to counter 21 as a safeguard. The frequency corresponding to the volume up command produces a 1 level signal which is as before supplied to the clock terminal of flip-flop 106. The Q output of flip-flop 106 is supplied to AND 108 which is now enabled by input terminal 104 at a 1 level. It should be noted that for insurance AND 110 is inhibited by a 0 level signal at output of inverter 105 to insure that no signal from the Q terminal of flip-flop 98 can pass. The 1 and 0 logic levels of the Q terminal of flip-flop 106 are then supplied through OR 112 to utilization means 20. It is this operation which provides the bi-stable picture control function. The 1 level will correspond to an on condition of the picture control and the 0 to off. Thus, it may be seen that the logic level at terminal 104 establishes cyclic or non-cyclic counting and through a series of enabled and inhibited logic gates establishes at the common output terminals either an eight-step multi-state bi-directional volume function or a four step cyclic volume function with a distinct bi-stable control function.

What has been shown is a novel integrated digital circuit utilizing an externally applied voltage level to produce two modes of operation for controlling various functions of a television receiver by means of common output pins. This permits a single integrated digital circuit to selectively actuate a variety of television receiver control functions in response to the same set of controlling frequencies.

While particular embodiments of the invention have been shown and described, it will be obvious to those skilled in the art that changes and modifications may be made thereto without departing from the invention in its broader aspects and, therefore, the aim in the appended claims is to cover all such changes and modifications as fall within the true spirit and scope of the invention.

What is claimed is:

1. A television remote control device for selectively activating functions of a television receiver in response to a plurality of actuating signals of different frequencies received from a remote location, said device including means for receiving and processing said actuating signals, means for actuating said functions and an integrated circuit, said integrated circuit having a predetermined number of connection pins and comprising:
counting means for distinguishing among the processed plurality of actuating signals based on frequency and having outputs indicative thereof; and
logic means coupled between said counting means and said actuating means for enabling, via output pins, said actuating means based upon said counting means outputs and being responsive to external voltages applied to one of said connection pins for selectively operating in a first mode in which actuating signals of two predetermined frequencies control a multi-state bi-directional function from said output pins and in a second mode in which said actuating signals of two predetermined frequencies control a cyclic multi-state function and a distinct bi-stable function from said output pins.

2. The device of claim 1 wherein said logic means includes three flip-flops arranged in the form of a three stage binary counter and a fourth flip-flop, said fourth flip-flop and the highest order stage of said binary counter being coupled to one of said output pins.

3. The device of claim 2 wherein said logic means further includes an OR gate for detecting the 0 state of said binary counter and a NAND gate for detecting the 7 state of said binary counter, said OR and said NAND gates being coupled to said binary counter providing counting stops to prevent cyclic counting operation.

4. The device of claim 3 further including a first AND gate to which the output of said fourth flip-flop is coupled and a second AND gate to which the highest order stage of said binary counter is coupled, wherein said external voltage in said first mode inhibits said first AND gate and enables said second AND gate and in said second mode enables said first AND gate and inhibits said second AND gate.

5. The device of claim 4 wherein said multistate bi-directional function is an eight step volume function, said cyclic multistate function is a four step volume function and said distinct bi-stable function is a zoom picture display function.

* * * * *